(12) United States Patent
Wu et al.

(10) Patent No.: US 10,410,986 B2
(45) Date of Patent: Sep. 10, 2019

(54) SEMICONDUCTOR DEVICE AND MANUFACTURE THEREOF

(71) Applicants: Semiconductor Manufacturing International (Shanghai) Corporation, Shanghai (CN); Semiconductor Manufacturing International (Beijing) Corporation, Beijing (CN)

(72) Inventors: You Wu, Shanghai (CN); Jun Zhu, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 0 days.

(21) Appl. No.: 15/980,033

(22) Filed: May 15, 2018

(65) Prior Publication Data

US 2018/0337150 A1 Nov. 22, 2018

(30) Foreign Application Priority Data

May 18, 2017 (CN) .......................... 2017 1 0350090

(51) Int. Cl.
  *H01L 23/12* (2006.01)
  *H01L 23/00* (2006.01)
  *H01L 27/146* (2006.01)

(52) U.S. Cl.
  CPC .............. *H01L 24/05* (2013.01); *H01L 24/03* (2013.01); *H01L 27/1464* (2013.01);
  (Continued)

(58) Field of Classification Search
  CPC . H01L 2224/48247; H01L 2224/04105; H01L 2224/05124; H01L 23/5389;
  (Continued)

(56) References Cited

U.S. PATENT DOCUMENTS

| | | | | |
|---|---|---|---|---|
| 6,063,703 A | * | 5/2000 | Shinriki | H01L 21/28556 257/E21.582 |
| 2007/0152226 A1 | * | 7/2007 | Salam | H01L 25/0756 257/79 |
| 2014/0131882 A1 | * | 5/2014 | Law | H01L 23/481 257/774 |

* cited by examiner

*Primary Examiner* — Theresa T Doan
(74) *Attorney, Agent, or Firm* — Innovation Counsel LLP (57) ABSTRACT

A semiconductor device and its manufacturing method are presented. The manufacturing method includes: providing a semiconductor structure comprising: an interlayer dielectric layer, a first metal layer surrounded by the interlayer dielectric layer, and a semiconductor layer on the interlayer dielectric layer; etching the semiconductor layer to form an opening exposing the interlayer dielectric layer, wherein the opening comprises a first opening and a second opening on the first opening; forming an insulation layer on the semiconductor structure; etching the insulation layer and the interlayer dielectric layer at the bottom of the first opening to form a groove exposing a portion of the first metal layer; forming a second metal layer on the insulation layer and on the bottom and a side surface of the groove; and patterning the second metal layer. The second metal layer in this inventive concept can be removed more completely than conventional methods.

6 Claims, 9 Drawing Sheets

(52) U.S. Cl.
CPC .. *H01L 27/14632* (2013.01); *H01L 27/14687* (2013.01); *H01L 2224/0345* (2013.01); *H01L 2224/03614* (2013.01); *H01L 2224/03622* (2013.01); *H01L 2224/04042* (2013.01); *H01L 2224/05018* (2013.01); *H01L 2224/05027* (2013.01); *H01L 2224/05124* (2013.01)

(58) Field of Classification Search
CPC ........... H01L 2924/01014; H01L 24/48; H01L 24/05; H01L 2224/05624; H01L 24/03; H01L 24/29; H01L 2924/01013; H01L 2224/81424; H01L 2224/04042; H01L 24/24; H01L 2224/13124; H01L 24/49
USPC ........................................................ 257/773
See application file for complete search history.

SEMICONDUCTOR DEVICE AND MANUFACTURE THEREOF

CROSS-REFERENCE TO RELATED APPLICATION

This application claims priority to and benefit of Chinese Patent Application No. 201710350090.0 filed on May 18, 2017, which is incorporated herein by reference in its entirety.

BACKGROUND

(a) Field of the Invention

This inventive concept relates generally to semiconductor techniques, and more specifically, to a semiconductor device and its manufacturing method.

(b) Description of the Related Art

The manufacture of Backside Illuminated Complementary Metal-Oxide-Semiconductor Image Sensor (BSI CIS) is a complicated process. Typically, after a device process is completed, a device wafer is bonded to a handle wafer, and a patterned liner layer (e.g., an aluminum layer) is formed for metal wire connection. Major procedures in a BSI CIS manufacturing process include a procedure to etch silicon to form an opening and a procedure to etch an interlayer dielectric layer to form a groove.

Figure 1A:
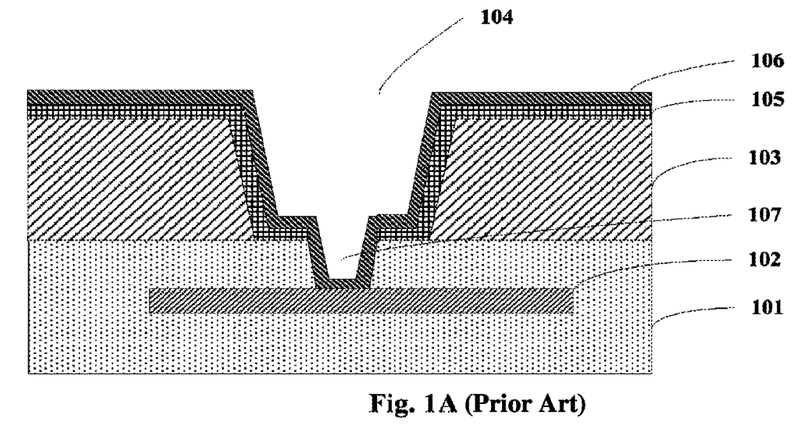
FIGS. 1A and 1B each show a cross-sectional view illustrating a stage of a conventional semiconductor device manufacturing method.
Figure 1B:
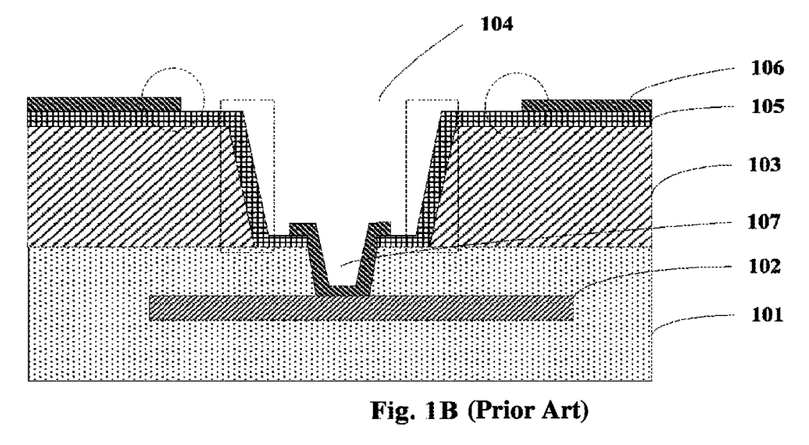

FIG. 1A shows a structure in a conventional manufacturing method, the structure includes an interlayer dielectric layer 101, a metal wire 102, a silicon layer 103, an insulation layer 105, and an aluminum layer (i.e., a liner layer) 106. As shown in FIG. 1A, the insulation layer 105 is formed on the bottom and a side surface of an opening 104 and on the silicon layer 103, and the aluminum layer 106 is formed on the insulation layer 105 and on the bottom and a side surface of a groove 107. As shown in FIG. 1B, in a succeeding step, the aluminum layer 106 is patterned by etching and removing a portion of the aluminum layer 106 on the bottom and the side surface of the opening 104 and on the silicon layer 103, the patterned aluminum layer 106 may work as a lead to the metal wire 102.

In conventional manufacturing methods such as the one described above, the etching process conducted on the aluminum layer may leave some aluminum residues on the side surface of the opening, these aluminum residues may peel off and cause defects or even form a short circuit in the device in succeeding steps.

In some conventional methods, etching parameters for aluminum may be adjusted to increase the etching anisotropy for aluminum in order to reduce aluminum residue left on the side surface of the opening. This method, however, may inadvertently damage the remaining aluminum layer, especially the side surface of the remaining aluminum layer, on the silicon layer.

SUMMARY

Based on the investigation to the issues in conventional methods, this inventive concept presents an innovative solution that remedies at least some of the limitations in conventional methods.

This inventive concept first presents a semiconductor manufacturing method, comprising:
providing a semiconductor structure, comprising:
an interlayer dielectric layer;
a first metal layer surrounded by the interlayer dielectric layer; and
a semiconductor layer on the interlayer dielectric layer;
etching the semiconductor layer to form an opening exposing the interlayer dielectric layer, wherein the opening comprises a first opening and a second opening on the first opening, with the first opening exposing a portion of the interlayer dielectric layer, and the first opening and the second opening forming a staircase pattern;
forming an insulation layer on the semiconductor structure;
etching a portion of the insulation layer and a portion of the interlayer dielectric layer at the bottom of the first opening to form a groove exposing a portion of the first metal layer;
forming a second metal layer on the insulation layer and on the bottom and a side surface of the groove, with the second metal layer contacting the first metal layer; and
patterning the second metal layer to remove a portion of the second metal layer on a side surface of the opening and on the staircase pattern.

Additionally, in the aforementioned method, the width of the second opening may be larger than the width of the first opening.

Additionally, in the aforementioned method, an angle between a side surface of the first opening and the bottom of the first opening may be an obtuse angle (e.g., in a range of 100° to 110°), and an angle between a side surface of the second opening and a flat surface of the staircase pattern may be an obtuse angle (e.g., in a range of 100° to 110°).

Additionally, in the aforementioned method, etching the semiconductor layer to form an opening exposing the interlayer dielectric layer may comprise:
forming a patterned first hard mask layer on the semiconductor structure, wherein the first hard mask layer comprises a through-hole exposing a first portion of the semiconductor layer;
etching the semiconductor layer with respect to the first hard mask layer to form a well;
remove a portion of the first hard mask layer to enlarge the through-hole and to expose a second portion of the semiconductor layer near the well;
etching the well and the second portion of the semiconductor structure to form a first opening exposing a portion of the interlayer dielectric layer and a second opening on the first opening; and
removing the first hard mask layer.

Additionally, in the aforementioned method, a portion of the first hard mask layer may be removed to enlarge the through-hole by adjusting the concentration of etching gas.

Additionally, in the aforementioned method, the etching gas may comprise oxygen.

Additionally, in the aforementioned method, etching a portion of the insulation layer and a portion of the interlayer dielectric layer at the bottom of the first opening to form a groove exposing a portion of the first metal layer may comprise:
forming a patterned second hard mask layer on the semiconductor structure after the insulation layer has been formed, with the second hard mask layer exposing a portion of the insulation layer at the bottom of the first opening;
etching the exposed portion of the insulation layer and a portion of the interlayer dielectric layer underneath the insulation layer with respect to the second hard mask layer to form a groove, with the groove exposing a portion of the first metal layer; and removing the second hard mask layer.

Additionally, in the aforementioned method, patterning the second metal layer to remove a portion of the second metal layer on a side surface of the opening and on the staircase pattern may comprise:

forming a patterned third hard mask layer on the second metal layer, with the third hard mask layer exposing a portion of the second metal layer on the side surface of the opening and on the staircase pattern;

etching the exposed portion of the second metal layer with respect to the third hard mask layer; and removing the third hard mask layer.

Additionally, in the aforementioned method, the interlayer dielectric layer may comprise silicon dioxide, the semiconductor layer may comprise silicon, the first metal layer may comprise aluminum, the insulation layer may comprise silicon dioxide, and the second metal layer may comprise aluminum.

This inventive concept further presents a semiconductor device, comprising:

an interlayer dielectric layer;

a first metal layer surrounded by the interlayer dielectric layer, wherein the interlayer dielectric layer comprises a groove exposing a portion of the first metal layer;

a semiconductor layer on the interlayer dielectric layer, wherein the semiconductor layer comprises an opening exposing the interlayer dielectric layer, and wherein the opening comprises a first opening and a second opening on the first opening, with the first opening exposing a portion of the interlayer dielectric layer, and the first opening and the second opening forming a staircase pattern;

an insulation layer on the semiconductor layer, on the bottom and a side surface of the opening, and on the staircase pattern; and a patterned second metal layer on the insulation layer and on the bottom and a side surface of the groove, with the second metal layer contacting the first metal layer.

Additionally, in the aforementioned device, the width of the second opening may be larger than the width of the first opening.

Additionally, in the aforementioned device, an angle between a side surface of the first opening and the bottom of the first opening may be an obtuse angle (e.g., in a range of 100° to 110°), and an angle between a side surface of the second opening and a flat surface of the staircase pattern may be an obtuse angle (e.g., in a range of 100° to 110°).

Additionally, in the aforementioned device, the interlayer dielectric layer may comprise silicon dioxide, the semiconductor layer may comprise silicon, the first metal layer may comprise aluminum, the insulation layer may comprise silicon dioxide, and the second metal layer may comprise aluminum.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

DETAILED DESCRIPTION OF THE EMBODIMENTS

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in details, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

In conventional methods, as shown in FIG. 1B, the opening 104 formed by etching the aluminum layer 106 has a small width-to-depth ratio, thus some aluminum residues may remain on the side surface of the opening 104 (the rectangle boxes in FIG. 1B), these aluminum residues may peel off and cause defect or even short circuit in the device in succeeding steps.

In some conventional methods, etching parameters for aluminum may be adjusted to increase the etching anisotropy for aluminum in order to reduce aluminum residue, this method, however, may inadvertently damage the remaining aluminum layer, especially the side surface of the remaining aluminum layer (circled regions in FIG. 1B), on the silicon layer and may damage the aluminum wire.

Figure 2:
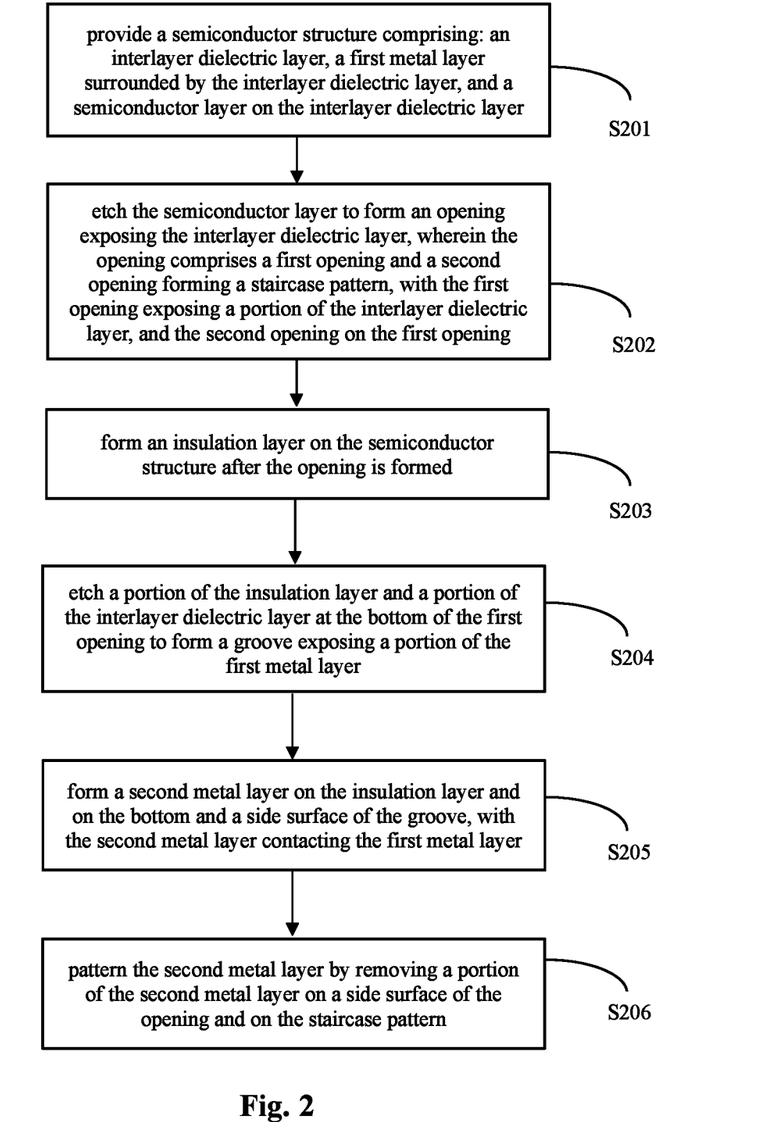
FIG. 2 shows a flowchart illustrating a semiconductor device manufacturing method in accordance with one embodiment of this inventive concept.

FIG. 2 shows a flowchart illustrating a semiconductor device manufacturing method in accordance with one embodiment of this inventive concept. FIGS. 3, 4, 5, 6, 7, 8, 9, 10, 11, 12, 13, 14, 15 and 16 each show a cross-sectional view illustrating a stage of a semiconductor device manufacturing method in accordance with one embodiment of this inventive concept. This semiconductor device manufacturing method is described below with reference to these drawings.

Referring to FIG. 2, in step S201, a semiconductor structure is provided, the semiconductor structure may comprise an interlayer dielectric layer, a first metal layer that is surrounded by the interlayer dielectric layer, and a semiconductor layer on the interlayer dielectric layer.

Figure 3:
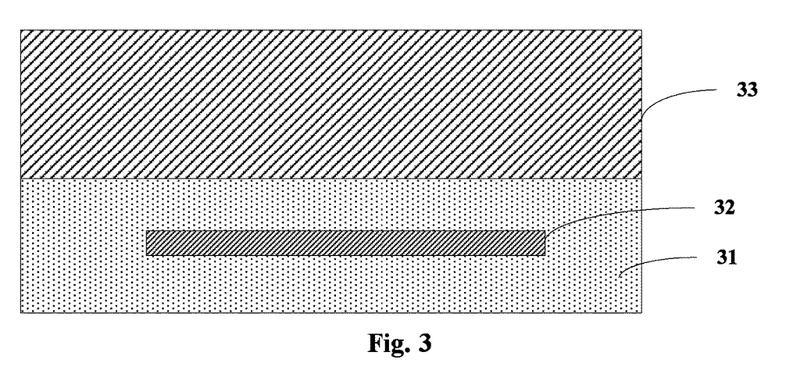
FIGS. 3, 4, 5, 6, 7, 8, 9, 10, 11, 12, 13, 14, 15 and 16 each show a cross-sectional view illustrating a stage of a semiconductor device manufacturing method in accordance with one embodiment of this inventive concept.

FIG. 3 shows a cross-sectional view illustrating step S201. Referring to FIG. 3, the semiconductor structure may comprise an interlayer dielectric layer 31, a first metal layer 32 that is surrounded by the interlayer dielectric layer 31, and a semiconductor layer 33 on the interlayer dielectric layer 31. The interlayer dielectric layer 31 may comprise silicon dioxide, the semiconductor layer 33 may comprise silicon, and the first metal layer 32 may comprise aluminum. In some embodiments, the first metal layer 32 may connect to a semiconductor device such as a BSI CIS device (not shown in the drawing).

Referring to FIG. 2, in step S202, the semiconductor layer is etched to form an opening exposing a portion of the interlayer dielectric layer, the opening comprises a first opening and a second opening on the first opening, with the first opening exposing a portion of the interlayer dielectric layer, and the first opening and the second opening forming a staircase pattern.

Step S202 is described below in details with reference to FIGS. 4, 5, 6, 7 and 8.

Figure 4:
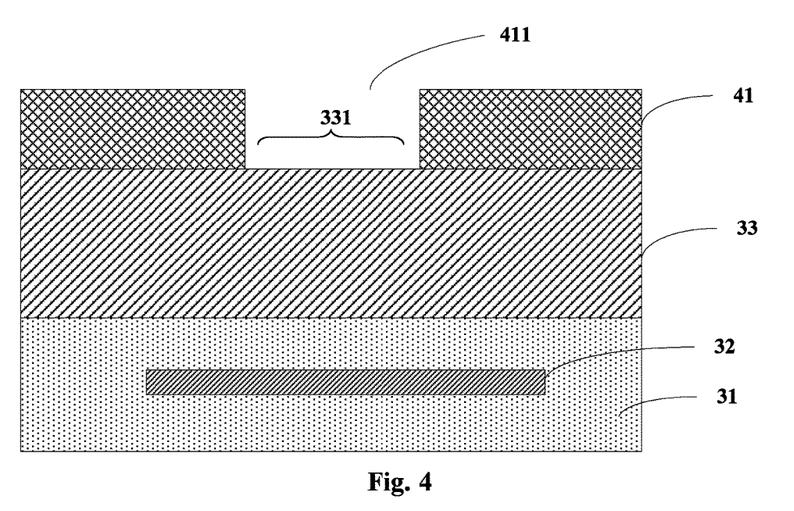

Referring to FIG. 4, step S202 comprises: forming a patterned first hard mask layer 41 (e.g., a photoresist layer) on the semiconductor layer 33. The first hard mask layer 41 has a through-hole 411 exposing a portion 331 of the semiconductor layer 33. The exposed portion 331 of the semiconductor layer 33 may be designated as a first portion of the semiconductor layer 33.

Figure 5:
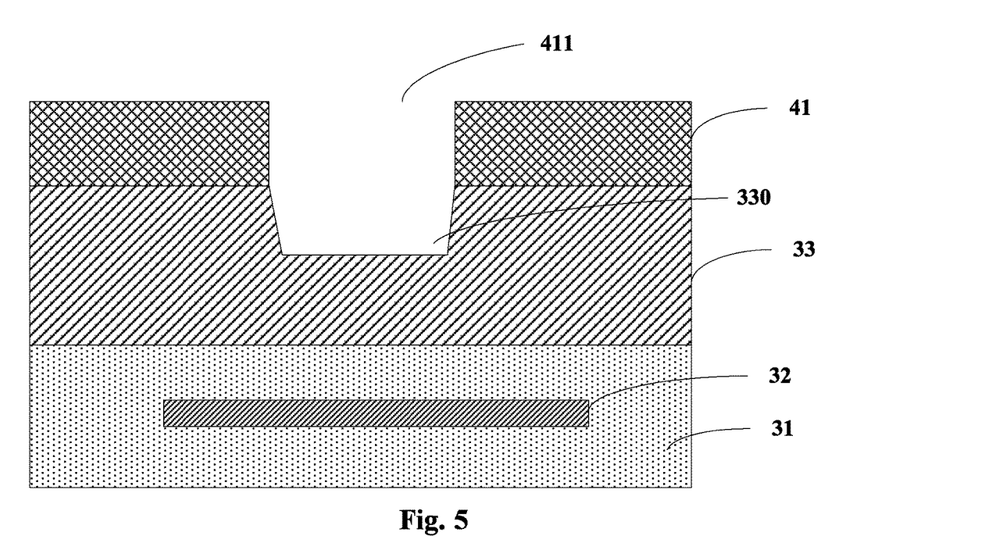

Next, referring to FIG. 5, step S202 may further comprise: etching the semiconductor layer 33 with respect to the first hard mask layer 41 to form a well 330. A portion of the semiconductor layer 33 may also be removed in this step.

Figure 6:
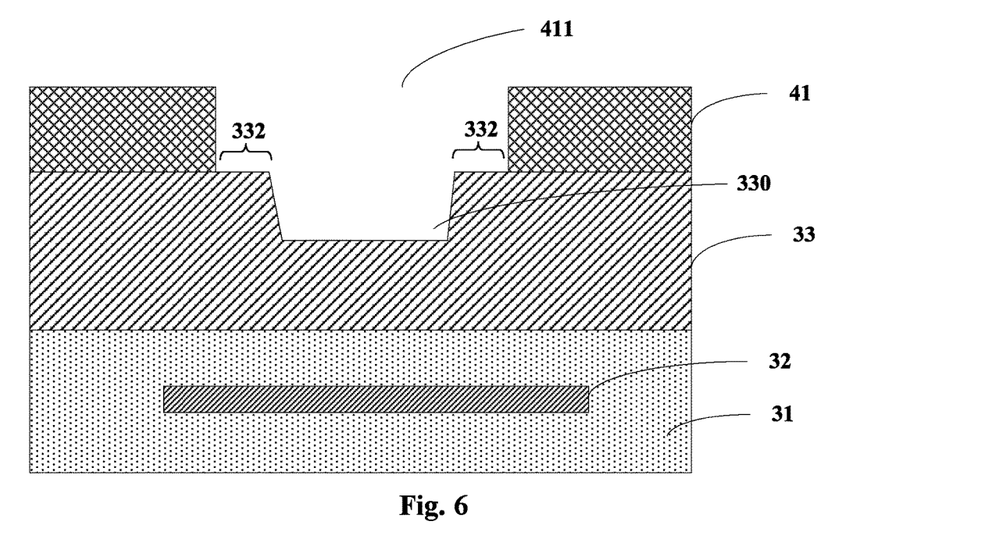

Next, referring to FIG. 6, step S202 may further comprise: after the well 330 is formed, removing a portion of the first hard mask layer 41 to enlarge the through-hole 411 so that another portion 332 of the semiconductor layer 33 near the well 330 becomes exposed. The newly exposed portion 332 of the semiconductor layer 33 after the through-hole 411 is enlarged may be designated as a second portion of the semiconductor layer 33.

In one embodiment, a portion of the first hard mask layer 41 may be removed to enlarge the through-hole 411 by adjusting the concentration of etching gas, and the etching gas may comprise oxygen.

Figure 7:
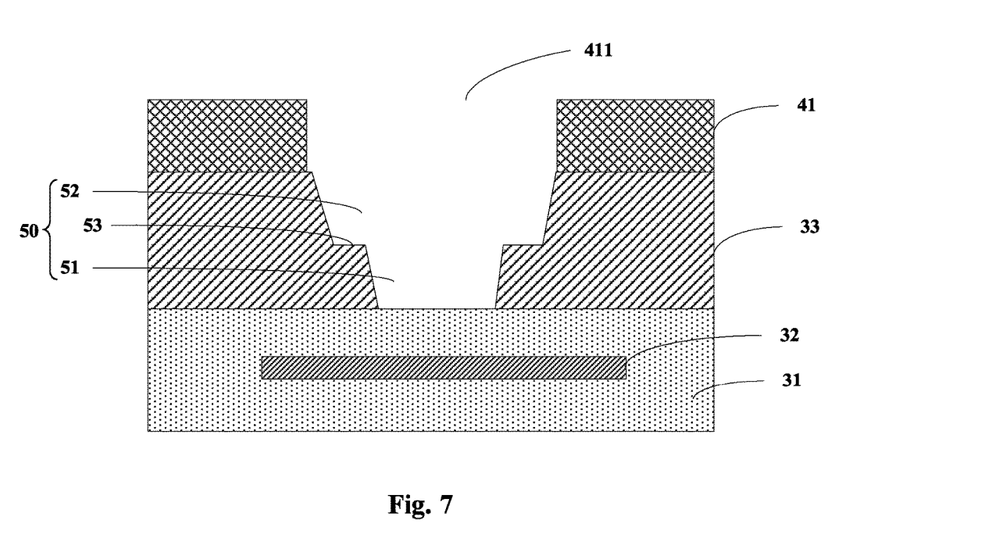

Next, referring to FIG. 7, step S202 may further comprise: etching the well 330 and the newly exposed portion 332 (the second portion) of the semiconductor layer 33 to form a first opening 51 and a second opening 52 on the first opening 51, with the first opening exposing a portion of the interlayer dielectric layer 31, and the first opening 51 and the second opening 52 forming a staircase pattern 53. In this step, the interlayer dielectric layer 31 may work as an etch-stop layer.

Figure 8:
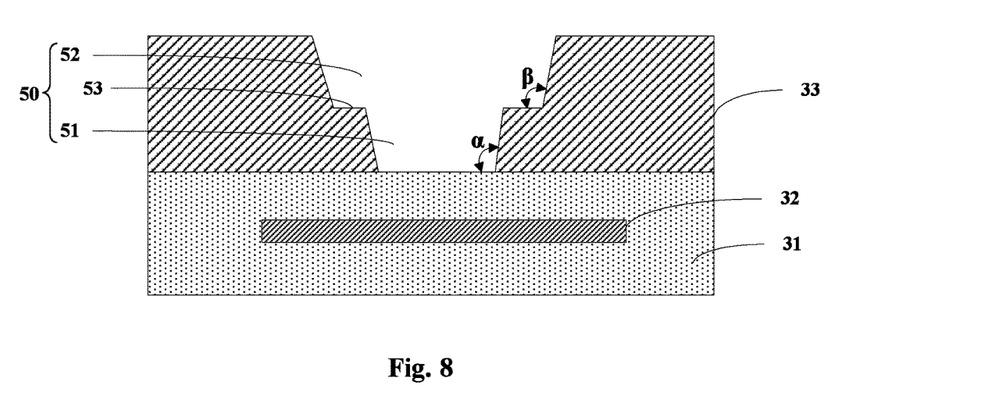

Next, referring to FIG. 8, step S202 may further comprise: removing the first hard mask layer 41. At this stage, an opening 50 exposing a portion of the interlayer dielectric layer 31 is formed, the opening 50 may comprise the first opening 51 and the second opening 52 on the first opening 51, with the first opening 51 exposing a portion of the interlayer dielectric layer 31, and the first opening 51 and the second opening 52 forming a staircase pattern 53. The width of the second opening 52 is larger than the width of the first opening 51.

Referring to FIG. 8, in one embodiment, an angle α between a side surface of the first opening 51 and the bottom of the first opening 51 may be an obtuse angle, the angle α may be in a range of 100° to 110° (e.g., 102° or 105°). In one embodiment, an angle β between a side surface of the second opening 52 and a flat surface of the staircase pattern 53 may be an obtuse angle, the angle β may be in a range of 100° to 110° (e.g., 102° or 105°).

Figure 9:
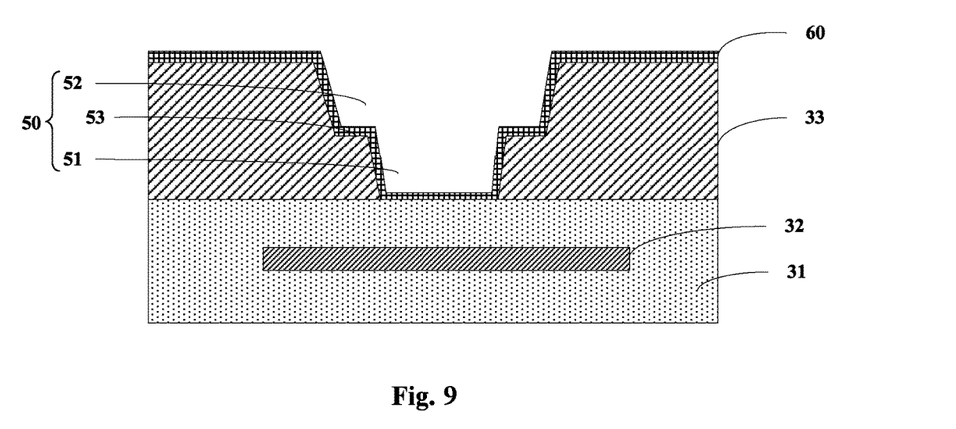

Referring to FIG. 2, in step S203, an insulation layer is formed on the semiconductor structure after the opening has been formed. FIG. 9 shows a cross-sectional view illustrating step S203. Referring to FIG. 9, an insulation layer 60 is formed at a substantially constant thickness (e.g., conformally formed by a deposition process) on the semiconductor structure of FIG. 8. The insulation layer 60 may be formed on the bottom and a side surface of the opening 50, on the staircase pattern 53, and on an upper surface of the semiconductor layer 33. The insulation layer 60 may comprise silicon dioxide.

Referring to FIG. 2, in step S204, a portion of the insulation layer and a portion of the interlayer dielectric layer at the bottom of the first opening are etched to form a groove exposing a portion of the first metal layer.

Step S204 is described below in details with reference to FIGS. 10, 11 and 12.

Figure 10:
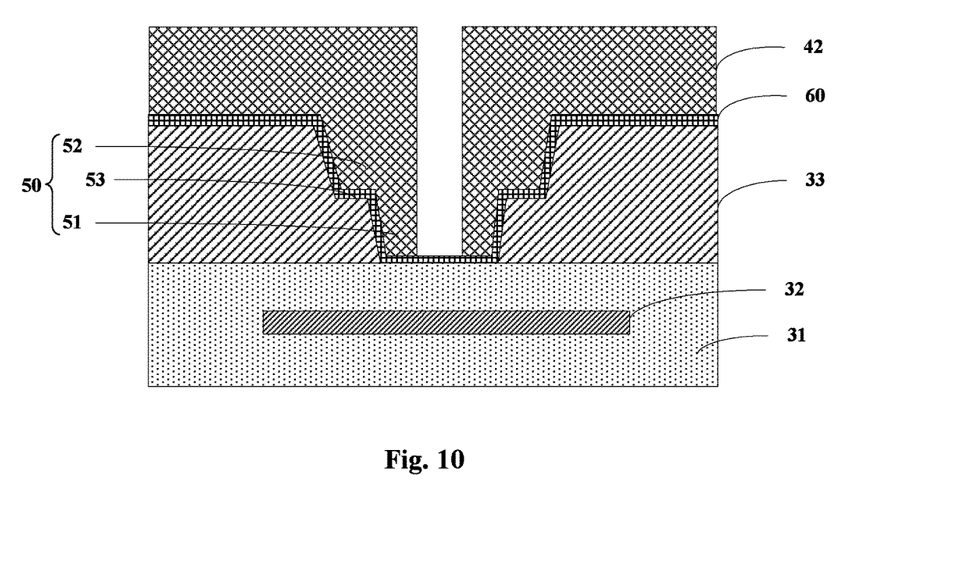

Referring to FIG. 10, step S204 may comprise: forming a second hard mask layer 42 (e.g., a photoresist layer) on the semiconductor structure after the insulation layer 60 has been formed, with the second hard mask layer 42 exposing a portion of the insulation layer 60 at the bottom of the first opening 51.

Figure 11:
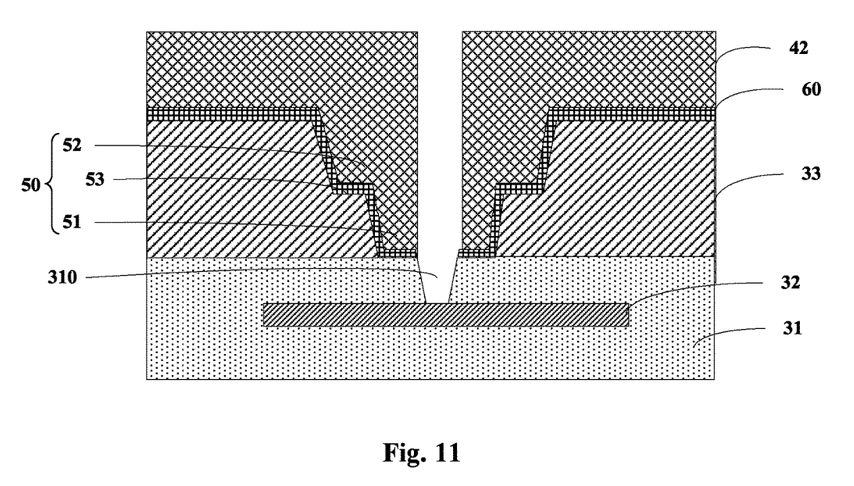

Next, referring to FIG. 11, step S204 may further comprise: etching the exposed portion of the insulation layer 60 and a portion of the interlayer dielectric layer 31 underneath the insulation layer 60 with respect to the second hard mask layer 42 to form a groove 310, with the groove 310 exposing a portion of the first metal layer 32.

Figure 12:
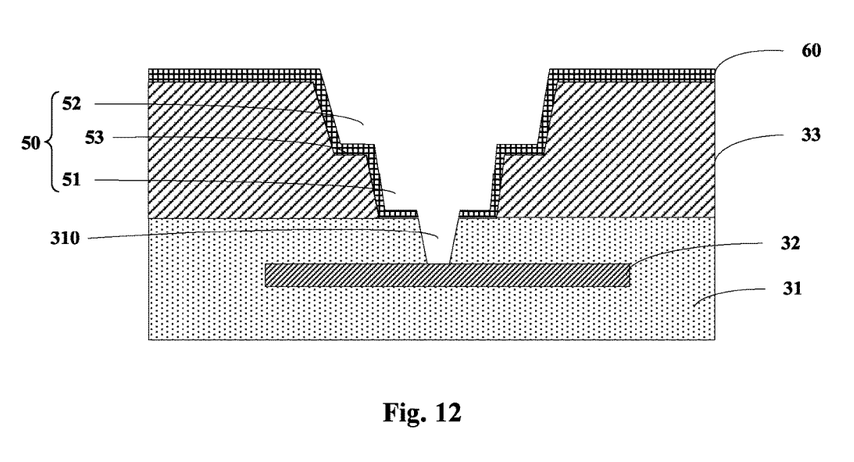

Next, referring to FIG. 12, step S204 may further comprise: removing the second hard mask layer 42. At this stage, a groove 310 exposing a portion of the first metal layer 32 is formed.

Referring to FIG. 2, in step S205, a second metal layer is formed on the insulation layer and on the bottom and a side surface of the groove, with the second metal layer contacting the first metal layer.

Figure 13:
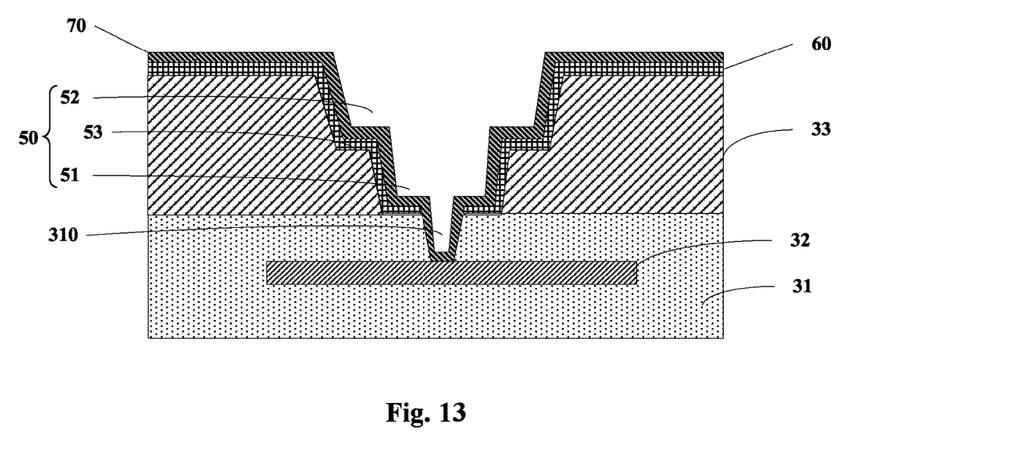

FIG. 13 shows a cross-sectional view illustrating step S205. Referring to FIG. 13, the second metal layer 70 may be formed on the insulation layer 60 and on the bottom and the side surface of the groove 310 by a sputtering process, with the second metal layer 70 contacting the first metal layer 32. The second metal layer 70 may comprise aluminum.

Referring to FIG. 2, in step S206, the second metal layer is patterned by removing a portion of the second metal layer on the side surface of the opening and on the staircase pattern.

Step 206 is described below in details with reference to FIGS. 14, 15 and 16.

Figure 14:
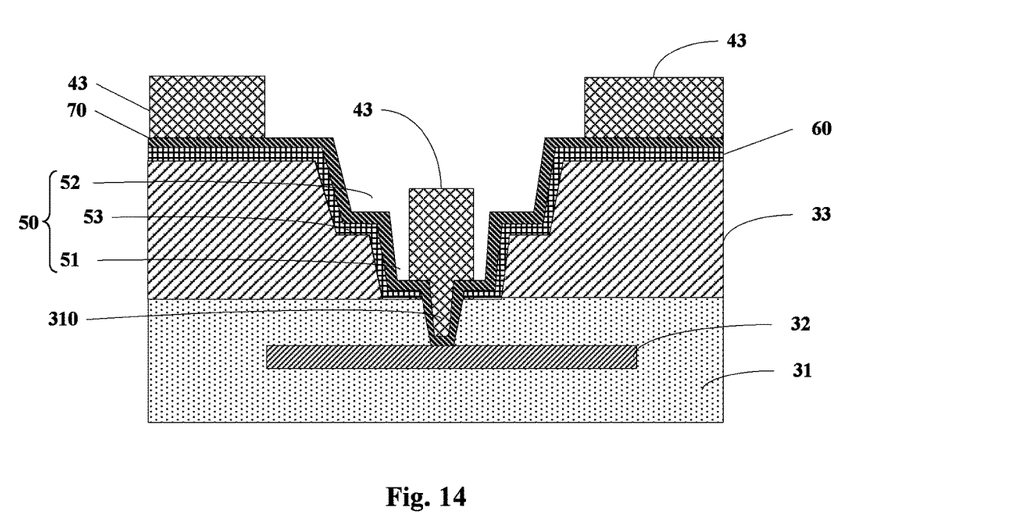

Referring to FIG. 14, step S206 may comprise: forming a third hard mask layer 43 (e.g., a photoresist layer) on the second metal layer 70, with the third hard mask layer 43 exposing a portion of the second metal layer 70 on the side surface of the opening 50 and on the staircase pattern 53.

Figure 15:
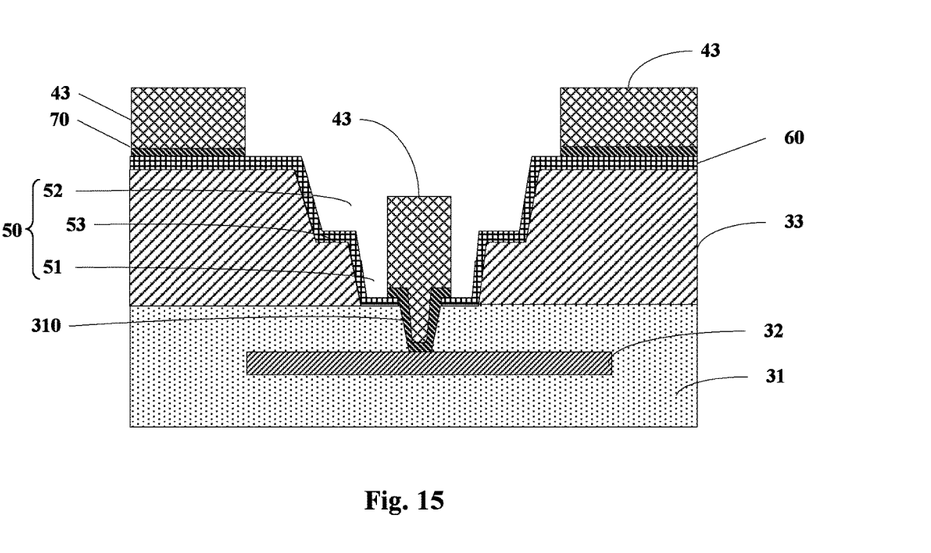

Next, referring to FIG. 15, step S206 may further comprise: removing the exposed portion of the second metal layer 70 by etching the second metal layer 70 with respect to the third hard mask layer 43.

Figure 16:
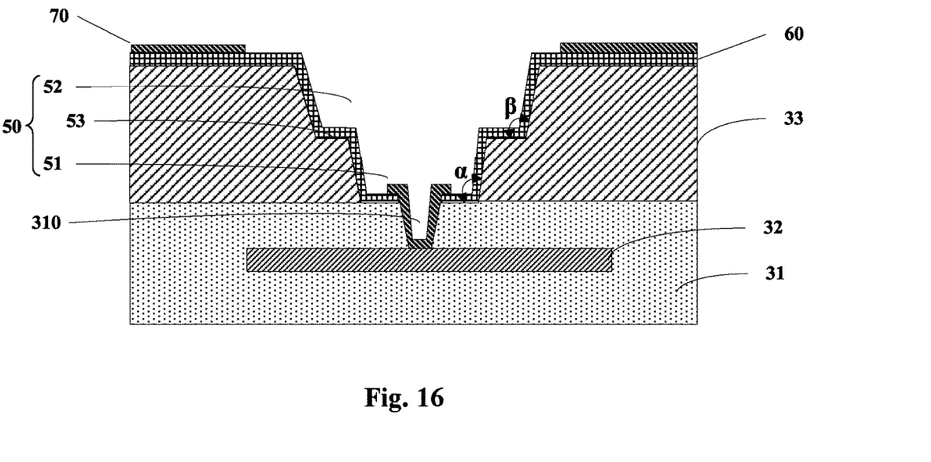

Next, referring to FIG. 16, step S206 may further comprise: removing the third hard mask layer 43. This concludes the patterning process on the second metal layer 70.

It should be understood that, although not shown in the cross-sectional view in FIG. 16, a portion of the second metal layer 70 on the semiconductor layer 33 is connected to a portion of the second metal layer 70 in the groove 310, a person of ordinary skill in the art in this field would understand that these two portion of the second metal layer 70 may connect at a cross-section that is different from the one shown in FIG. 16.

This concludes a semiconductor device manufacturing method in accordance with one or more embodiments of this inventive concept. This manufacturing method comprises: forming two cone-shaped openings (the first opening and the second opening) with one opening on top of the other by etching the semiconductor layer twice; forming an insulation layer on these openings; etching an interlayer dielectric layer to expose a metal layer; forming a second metal layer; and patterning the second metal layer to remove unwanted portion of the second metal layer.

In this manufacturing method, by etching the semiconductor layer twice, a first opening and a second opening are formed, with the second opening on the first opening, and the first opening and the second opening forming a staircase pattern. The staircase pattern effectively increases the contact area of the second metal layer to the etching agent during an etching process, and thus, comparing to conventional methods, unwanted portion of the second metal layer can be more effectively removed with little or no metal residue (e.g., aluminum residue) left. Additionally, this manufacturing method more effectively removes the metal residue (and reduces the defect caused by residue peel off) without changing the etching parameters (e.g., temperature, etching agent concentration), thus it does not incur additional damage to the portion of the second metal layer that need to be retained (i.e., the portion on the semiconductor layer).

It should be understood that, although two vertically-stacked openings are formed in this disclosure, the number of openings that can be formed in this inventive concept is not limited herein. In some embodiments of this inventive concept, more than two openings may be formed. For example, in one embodiment, three vertically-stacked openings may be formed and these three openings may form two staircase patterns.

This inventive concept further presents a semiconductor device based on the semiconductor manufacturing method presented above. Referring to FIG. 16, the semiconductor device comprises an interlayer dielectric layer 31 and a first metal layer 32 surrounded by the interlayer dielectric layer 31. The interlayer dielectric layer 31 comprises a groove 310 exposing a portion of the first metal layer 32. The interlayer dielectric layer 31 may comprise silicon dioxide, and the first metal layer 32 may comprise aluminum.

Referring to FIG. 16, the semiconductor device may further comprise a semiconductor layer 33 on the interlayer dielectric layer 31, and the semiconductor layer 33 may comprise silicon. The semiconductor layer 33 may comprise an opening 50 exposing a portion of the interlayer dielectric layer 31, wherein the opening 50 comprises a first opening 51 and a second opening 52 on the first opening 51, with the first opening 51 exposing a portion of the interlayer dielectric layer 31, and the first opening 51 and the second opening 52 forming a staircase pattern 53. The width of the second opening 52 is larger than the width of the first opening 51.

In one embodiment, an angle $\alpha$ between a side surface of the first opening 51 and the bottom of the first opening 51 may be an obtuse angle, the angle $\alpha$ may be in a range of 100° to 110° (e.g., 102° or 105°). In one embodiment, an angle $\beta$ between a side surface of the second opening 52 and a flat surface of the staircase pattern 53 may be an obtuse angle, the angle $\beta$ may be in a range of 100° to 110° (e.g., 102° or 105°).

Referring to FIG. 16, the semiconductor device may further comprise an insulation layer 60 on the semiconductor layer 33, on the bottom and the side surface of the opening 50, and on the staircase pattern 53. The insulation layer 60 may comprise silicon dioxide.

Referring to FIG. 16, the semiconductor device may further comprise a patterned second metal layer 70 on the insulation layer 60 and on the bottom and a side surface of a groove 310, with the second metal layer 70 contacting the first metal layer 32. The second metal layer 70 may comprise aluminum.

In the semiconductor device described above, two vertically-stacked openings (the first opening and the second opening) are formed in the semiconductor layer, and these two openings form a staircase pattern. The staircase pattern effectively increases the contact area of the second metal layer to the etching agent during an etching process, and thus, comparing to conventional methods, unwanted portion of the second metal layer can be more effectively removed with little or no metal residue (e.g., aluminum residue) left. Additionally, this semiconductor device more effectively removes the metal residue (and reduces the defect caused by residue peel off) without changing the etching parameters (e.g., temperature, etching agent concentration), thus it does not incur additional damage to the portion of the second metal layer that need to be retained (i.e., the portion on the semiconductor layer).

This concludes the description of a semiconductor device and its manufacturing method in accordance with one or more embodiments of this inventive concept. For purposes of conciseness and convenience, some components or procedures that are well known to one of ordinary skills in the art in this field are omitted. These omissions, however, do not prevent one of ordinary skill in the art in this field to make and use the inventive concept herein disclosed.

While this inventive concept has been described in terms of several embodiments, there are alterations, permutations, and equivalents, which fall within the scope of this disclosure. It shall also be noted that there are alternative ways of implementing the methods and/or apparatuses of the inventive concept. Furthermore, embodiments may find utility in other applications. It is therefore intended that the claims be interpreted as including all such alterations, permutations, and equivalents. The abstract section is provided herein for convenience and, due to word count limitation, is accordingly written for reading convenience and shall not be employed to limit the scope of the claims.

What is claimed is:

1. A semiconductor device, comprising:
   an interlayer dielectric layer;
   a first metal layer surrounded by the interlayer dielectric layer, wherein the interlayer dielectric layer comprises a groove exposing a portion of the first metal layer;
   a semiconductor layer on the interlayer dielectric layer, wherein the semiconductor layer comprises an opening exposing the interlayer dielectric layer, and wherein the opening comprises a first opening and a second opening on the first opening, with the first opening exposing a portion of the interlayer dielectric layer, and the first opening and the second opening forming a staircase pattern;
   an insulation layer on the semiconductor layer, on the bottom and a side surface of the opening, and on the staircase pattern; and
   a patterned second metal layer on the insulation layer and on the bottom and a side surface of the groove, with the second metal layer contacting the first metal layer, wherein the insulation layer comprises a first side, a second side, and a third side, wherein the first side is completely positioned inside the second opening and is connected through the second side to the third side, wherein the second side is oblique relative to each of the first side and the third side, wherein the third side directly contacts the second metal layer, and wherein both the first side and the second side are completely exposed by the second metal layer between two opposite portions of the second metal layer.

2. The device of claim 1, wherein the width of the second opening is larger than the width of the first opening.

3. The device of claim 1, wherein an angle between a side surface of the first opening and the bottom of the first opening is an obtuse angle, and an angle between a side surface of the second opening and a flat surface of the staircase pattern is an obtuse angle.

4. The device of claim 1, wherein an angle between a side surface of the first opening and the bottom of the first opening is in a range of 100° to 110°, and an angle between a side surface of the second opening and a flat surface of the staircase pattern is in a range of 100° to 110°.

5. The device of claim 1, wherein the interlayer dielectric layer comprises silicon dioxide, the semiconductor layer comprises silicon, the first metal layer comprises aluminum, the insulation layer comprises silicon dioxide, and the second metal layer comprises aluminum.

6. The device of claim 1, wherein the second metal layer directly contacts a face of the first metal layer, and wherein the first side of the insulation layer is parallel to the face of the first metal layer.

* * * * *